(12) United States Patent
Ishii et al.

(10) Patent No.: US 8,947,284 B2
(45) Date of Patent: Feb. 3, 2015

(54) AD CONVERTER AND AD CONVERSION METHOD

(71) Applicant: Kabushiki Kaisha Toshiba, Minato-ku (JP)

(72) Inventors: Hirotomo Ishii, Kanagawa (JP); Masanori Furuta, Kanagawa (JP); Nobuo Kano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/021,871

(22) Filed: Sep. 9, 2013

(65) Prior Publication Data

US 2014/0240158 A1 Aug. 28, 2014

(30) Foreign Application Priority Data

Feb. 25, 2013 (JP) .................................. 2013-34888

(51) Int. Cl.
*H03M 1/66* (2006.01)
*H03M 1/10* (2006.01)
*H03M 1/12* (2006.01)

(52) U.S. Cl.
CPC .......... *H03M 1/1023* (2013.01); *H03M 1/1215* (2013.01)
USPC ............................ 341/155; 341/118; 341/120

(58) Field of Classification Search
CPC ... H03M 1/0607; H03M 1/0673; H03M 1/12; H03M 1/1205; H03M 1/121; H03M 1/1215
USPC ......................................... 341/118, 120, 155
See application file for complete search history.

(56) References Cited

U.S. PATENT DOCUMENTS

| 5,675,334 | A  | * | 10/1997 | McCartney ................... 341/118 |
| 6,377,195 | B1 | * | 4/2002  | Eklund et al. ................. 341/118 |
| 7,358,876 | B1 | * | 4/2008  | Oo et al. ....................... 341/118 |
| 7,362,255 | B1 | * | 4/2008  | Tsyrganovich ............... 341/172 |
| 7,808,407 | B2 |   | 10/2010 | Zimmerman et al. |
| 7,880,649 | B2 |   | 2/2011  | Asami |
| 8,269,657 | B2 | * | 9/2012  | Anthony et al. .............. 341/118 |
| 8,294,606 | B2 |   | 10/2012 | Zimmerman et al. |
| 2013/0044019 | A1 |   | 2/2013  | Zimmerman et al. |

FOREIGN PATENT DOCUMENTS

| CN | 101335727 A | 1/2013 |
| EP | 2 015 454 B1 | 8/2013 |
| JP | 2008-312211 A | 12/2008 |
| JP | 2009-267931 A | 11/2009 |
| JP | 2011-097215 A | 5/2011 |

* cited by examiner

*Primary Examiner* — Khai M Nguyen

(74) *Attorney, Agent, or Firm* — White & Case LLP

(57) ABSTRACT

An A/D converter includes a plurality of AD converting sections that sequentially operate at predetermined intervals. The AD converting section has an ADC that converts an analog signal into a digital signal and outputs the digital signal, a memory that stores, as a specific polarity value, the polarity of a signal obtained by the ADC digitizing an analog signal at a reference voltage, an analog polarity converting circuit that inverts the polarity of the analog signal based on the specific polarity value and a set polarity value, which is previously set, and a digital polarity converting circuit that inverts the polarity of the digital signal based on the specific polarity value and the set polarity value.

14 Claims, 11 Drawing Sheets

AD CONVERTER AND AD CONVERSION METHOD

CROSS REFERENCE TO RELATED APPLICATION

This application is based upon and claims the benefit of priority from Japanese Patent Application No. 2013-34888 filed on Feb. 25, 2013; the entire contents of which are incorporated herein by reference.

FIELD

Embodiments described herein relate generally to an A/D converter and an AD conversion method.

BACKGROUND

In recent years, digital technologies have remarkably advanced, and there is an increasing demand for an improvement of power consumption, processing speed and precision of an AD converter that converts an analog signal into a digital signal. As a technique that allows an AD converter to operate at high speed with low power consumption, a time interleaving scheme, in which a plurality (M number) of AD converting units are arranged in parallel with each other and sequentially made to convert an analog signal into a digital signal in a time-division manner, is attracting attention.

If the M number of AD converting units having a sampling frequency of fs sequentially operate, the time-interleaved AD converter is equivalent to an AD converter having a sampling frequency of fs×M. Thus, an AD converter having a high sampling frequency can be provided by low-power AD converting units.

With the time-interleaved AD converter, a mismatch in characteristics among the plurality of AD converting units arranged in parallel with each other leads to an unwanted wave component (spurious) or error, resulting in a degradation of AD conversion characteristics. In particular, a degradation in AD conversion characteristics (in particular, an increase of unwanted wave components induced by an offset occurring between the input and the output (referred to simply as an offset hereinafter)) induced by a random error of element characteristics (a threshold voltage of a transistor, a resistance, a capacitance or the like) of individual AD converting units leads to a considerable degradation of change precision characteristics of the entire AD converter and therefore urgently needs to be improved.

A conventional AD converter reduces such offset-induced unwanted wave components by increasing the element size of the AD converting units. For example, if the element size is increased by a factor of four, the offset-induced unwanted wave components can be theoretically reduced approximately to half ($=1/\sqrt{4}$). However, if the element size is increased, a problem arises that the footprint of the entire chip also increases.

DETAILED DESCRIPTION

An AD converter according to an embodiment is an AD converter having a plurality of channels of AD converting sections that sequentially operate at predetermined time intervals. The AD converting section includes a data converting section that converts an analog signal into a digital signal and outputs the digital signal, an analog polarity converting circuit that inverts or does not invert a polarity of an analog input signal before supplying the analog input signal to the data converting section as the analog signal, a digital polarity converting circuit that inverts or does not invert a polarity of the digital signal from the data converting section before outputting the digital signal, and a controlling section that controls inversion processing by the analog polarity converting circuit and the digital polarity converting circuit based on information on an element characteristic of the data converting section.

In the following, embodiments will be described with reference to the drawings.

First Embodiment

Figure 1:
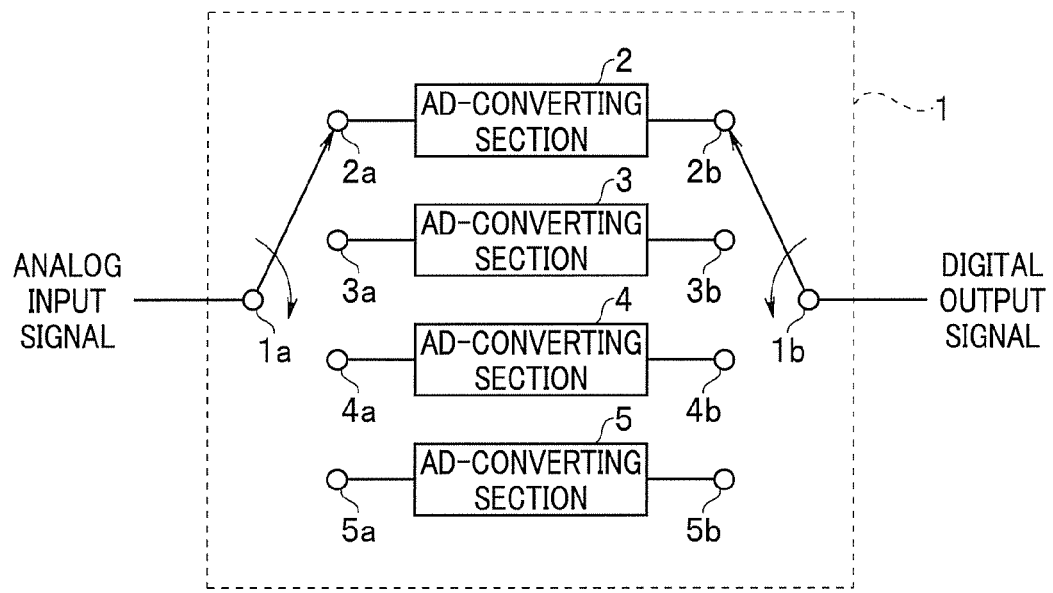
FIG. 1 is a block diagram for illustrating an example of a configuration of an AD converter 1 according to a first embodiment.

FIG. 1 is a block diagram for illustrating an example of a configuration of an AD converter 1 according to a first embodiment. The AD converter 1 according to this embodiment is a time-interleaved AD converter including a plurality of AD converting sections arranged in parallel with each other with respect to input/output signals. For example, as shown in FIG. 1, the AD converter 1 includes four (four channels of) AD converting sections 2, 3, 4 and 5, which have substantially the same structure. Note that sampling clocks shifted in phase by a predetermined amount are supplied to the respective AD converting sections 2 to 5. Each AD converting section 2 to 5 independently outputs a signal obtained by digitizing an amplitude value of an analog input signal at a timing responsive to the sampling clock.

With such a configuration, the AD converter can sample input signals at a sampling frequency higher than the frequency of the sampling clock thereof. For example, provided that the respective AD converting sections 2 to 5 have a sampling frequency of fs (that is, a sampling period of 1/fs), the sampling clocks supplied to the respective AD converting sections 2 to 5 are shifted in phase by 1/4*fs. As a result, the whole of the AD converter 1 can have an input signal sampling frequency equivalent to 4*fs.

Note that an input terminal 1a and input terminals 2a, 3a, 4a and 5a of the respective AD converting sections 2 to 5 can be provided as terminals of a rotary switch, which switchably establishes a connection at a timing of sampling. Alternatively, the respective converting sections 2 to 5 may be connected in parallel with each other so that the analog input signal is input to the input terminals 2a, 3a, 4a and 5a in parallel with each other. Similarly, an output terminal 1b and output terminals 2b, 3b, 4b and 5b of the respective AD converting sections 2 to 5 may be provided as terminals of a rotary switch, which switchably establishes a connection at a timing of sampling, or may be directly connected to each other. (Note that in the case of the direct connection, the other outputs other than any one output are controlled to be in a high impedance state.)

Figure 2:
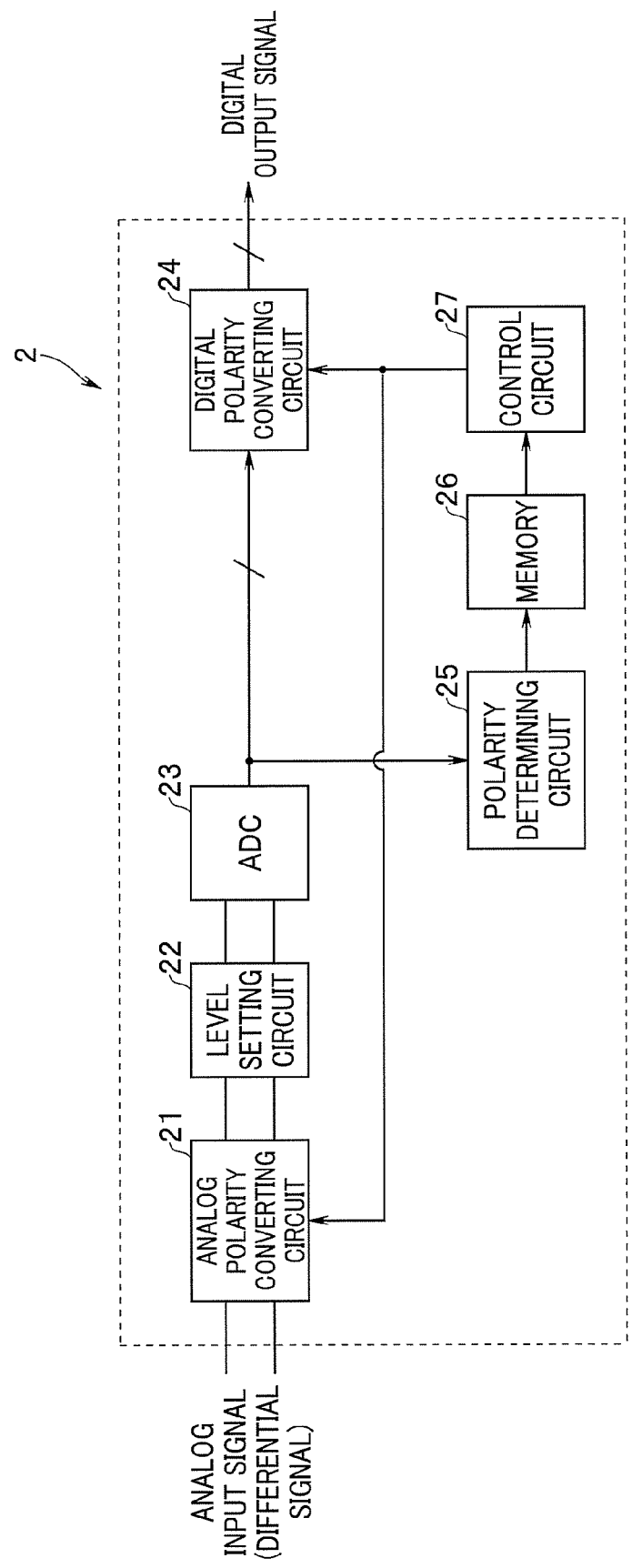
FIG. 2 is a block diagram for illustrating an example of a configuration of an AD converting section 2 according to the first embodiment.

In the following, a detailed configuration of the AD converting section 2 shown in FIG. 1 will be described with reference to FIG. 2. Note that the AD converting sections 3 to 5 have the same configuration as the AD converting section 2 described below with reference to FIG. 2 and therefore will not be described. FIG. 2 is a block diagram for illustrating an example of the configuration of the AD converting section 2 according to the first embodiment.

As shown in FIG. 2, the AD converting section 2 that converts a differential input signal includes an analog polarity converting circuit 21, a level setting circuit 22, an ADC (data converting section) 23 and a digital polarity converting circuit 24. The analog polarity converting circuit 21 has a function of converting the polarity of the input differential analog signal and outputting the input differential analog signal having the polarity inverted. The level setting circuit 22 generates and outputs a differential analog signal at 0[V] as a reference voltage. The ADC 23 converts the input differential analog signal into a digital signal and outputs the digital signal. The digital polarity converting circuit 24 has a function of converting the polarity of the digital signal output from the ADC 23 and outputting the digital signal having the polarity inverted. Note that the ADC 23 converts the differential analog input signal into a digital signal. Therefore, two signal lines connected to each of the analog polarity converting circuit 21, the level setting circuit 22 and the ADC 23 provide a differential signal.

The AD converting section 2 further includes a polarity determining circuit 25, a memory 26 and a control circuit 27. The polarity determining circuit 25 determines the polarity of the digital signal output from the ADC 23 in the case where the differential analog signal at the reference voltage is input. The memory 26 stores a determination result output from the polarity determining circuit 25. The control circuit 27 controls operations of the analog polarity converting circuit 21 and the digital polarity converting circuit 24 based on the determination result stored in the memory 26 or the like.

Figure 3:
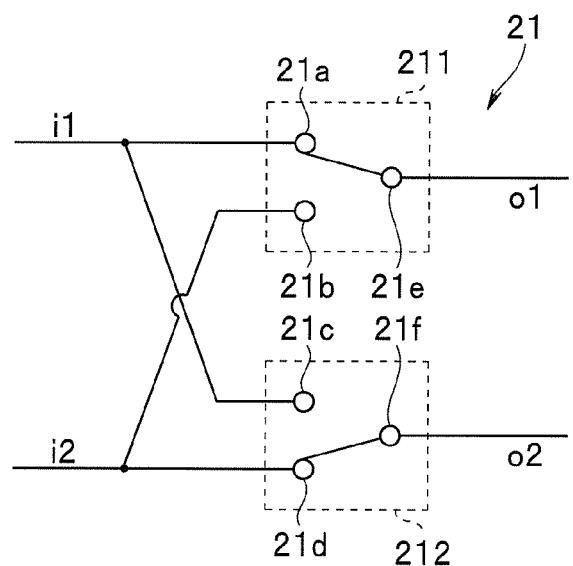
FIG. 3 is a circuit diagram showing an example of an analog polarity converting circuit 21.

An example of a specific configuration of the analog polarity converting circuit 21 is shown in FIG. 3. FIG. 3 is a circuit diagram showing an example of the analog polarity converting circuit 21. As shown in FIG. 3, the analog polarity converting circuit 21 includes differential input signal lines i1 and i2, four input terminals 21a, 21b, 21c and 21d, differential output signal lines o1 and o2, and two output terminals 21e and 21f, for example. Each of the differential input signal lines i1 and i2 are connected to two input terminals. More specifically, a first input signal line i1 is connected to the input terminals 21a and 21c, and a second input signal line i2 is connected to the input terminal 21b and 21d. The output terminal 21e is connected to a first output signal line o1, and the output terminal 21f is connected to a second output signal line o2.

The input terminals 21a and 21b and the output terminal 21e are provided as terminals of a three-way switch 211. To output the input signal as it is without converting the polarity thereof, the three-way switch 211 switchably connects the input terminal 21a and the output terminal 21e to each other. To convert the polarity of the input signal into an opposite polarity before outputting the input signal, the three-way switch 211 switchably connects the input terminal 21b and the output terminal 21e to each other.

Similarly, the input terminals 21c and 21d and the output terminal 21f are also provided as terminals of a three-way switch 212. To output the input signal as it is without converting the polarity thereof, the three-way switch 212 switchably connects the input terminal 21d and the output terminal 21f to each other. To convert the polarity of the input signal into an opposite polarity before outputting the input signal, the three-way switch 212 switchably connects the input terminal 21c and the output terminal 21f to each other.

That is, in the case where the input signal to the analog polarity converting circuit 21 is output to the level setting circuit 22 without changing the polarity of the input signal, the switch 211 connects the first input signal line i1 and the first output signal line o1 to each other, and the switch 212 connects the second input signal line i2 and the second output signal line o2 to each other. On the other hand, in the case where the input signal to the analog polarity converting circuit 21 is output to the level setting circuit 22 after the polarity of the input signal is converted into the opposite polarity, the switch 211 connects the second input signal line i2 and the first output signal line o1 to each other, and the switch 212 connects the first input signal line i1 and the second output signal line o2 to each other.

A voltage level of the differential analog signal input to the analog polarity converting circuit 21 is a voltage (=Vi1) of the first input signal line i1 minus a voltage (=Vi2) of the second input signal line i2. A voltage level of the analog signal output from the analog polarity converting circuit 21 is a voltage of the first output signal line o1 minus a voltage of the second output signal line o2. In the case where the polarity conversion does not occur, the voltage of the first output signal line o1 is equal to the voltage (=Vi1) of the first input signal line i1, and the voltage of the second output signal line o2 is equal to the voltage (=Vi2) of the second input signal line i2. Therefore, both the voltage level of the input analog signal and the voltage level of the output analog signal are Vi1-Vi2. On the other hand, in the case where the polarity conversion to the opposite polarity occurs, the voltage of the first output signal line o1 is equal to the voltage (=Vi2) of the second input signal line i2, and the voltage of the second output signal line o2 is equal to the voltage (=Vi1) of the first input signal line i1. Therefore, the voltage level of the input analog signal is Vi1-Vi2, while the voltage level of the output analog signal is −(Vi1-Vi2).

Note that switching of the three-way switches 211 and 212 occurs in response to an instruction from the control circuit 27.

Figure 4:
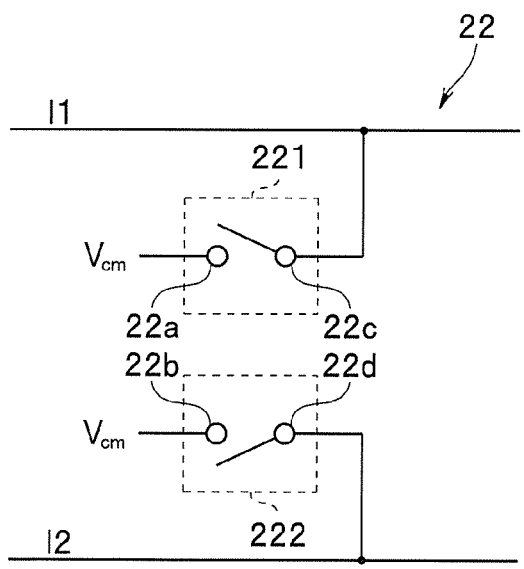
FIG. 4 is a circuit diagram showing an example of a level setting circuit 22.

Next, an example of a specific configuration of the level setting circuit 22 is shown in FIG. 4. FIG. 4 is a circuit diagram showing an example of the level setting circuit 22. The level setting circuit 22 is a circuit that applies a preset reference voltage $V_{cm}$ to both differential input signal lines 11 and 12 connected thereto to set the output voltage value at 0. For example, as shown in FIG. 4, the level setting circuit 22 has switches 221 and 222 capable of connecting reference voltage input terminals 22a and 22b on two signal lines previously set at the voltage $V_{cm}$ to the differential input signal lines 11 and 12 via output terminals 22c and 22d, respectively. More specifically, the switch 221 is turned on to connect the reference voltage input terminal 22a and the output terminal 22c to each other. The switch 222 is turned on to connect the reference voltage input terminal 22b and the output terminal 22d to each other. That is, if the switches 221 and 222 are turned on at the same time, the voltages of the differential input signal lines 11 and 12 are set at the reference voltage $V_{cm}$. The output voltage of the level setting circuit 22 is the difference between the voltage of one differential input signal line 11 and the voltage of the other differential input signal line 12 and therefore $V_{cm} - V_{cm} = 0$.

The digital polarity converting circuit 24 is formed by a number of exclusive-OR circuits (referred to as XOR circuits hereinafter) equal to the number of bits of the output signal from the ADC 23, for example. Two signals, a signal formed by a predetermined number of bits of the output signal from the ADC 23 and a control signal output from the control circuit 27, are input to each XOR circuit. For example, in the case where the output signal of the ADC 23 is an 8-bit signal, the digital polarity converting circuit 24 is formed by eight XOR circuits, and the value of each bit of a bit string is input to a different XOR circuit.

In the case where the signal input to the digital polarity converting circuit 24 is output as it is without changing the polarity thereof, the control circuit 27 inputs a 1-bit control signal having a value of 0 to all the XOR circuits. In this case, each XOR circuit outputs the result of XOR operation of the value input from the ADC 23 and 0, which is the value of the control signal, so that each XOR circuit outputs the value input from the ADC 23 as it is. On the other hand, in the case where the signal input to the digital polarity converting circuit 24 is output after the polarity thereof is converted, the control circuit 27 inputs a 1-bit control signal having a value of 1 to all the XOR circuits. In this case, each XOR circuit outputs the result of XOR operation of the value input from the ADC 23 and 1, which is the value of the control signal, so that each XOR circuit outputs the value 1 if the value input from the ADC 23 is 0, and outputs the value of 0 if the value input from the ADC 23 is 1. The values output from the respective XOR circuits are arranged at the same positions as in the original bit string and then output.

The polarity determining circuit 25 is a circuit that determines the polarity of the digital output signal from the ADC 23 in the case where the level setting circuit 22 inputs the analog signal at the reference voltage to the ADC 23. That is, the polarity determining circuit 25 is a circuit that determines the polarity of an offset of the ADC 23. In the case where the analog signal at 0[V] as a reference voltage is input, a most significant bit (MSB) of the digital signal indicates the polarity. More specifically, in the case where the digital output signal is expressed in two's complement, the polarity of the digital signal is positive if the MSB is 0, and the polarity of the digital signal is negative if the MSB is 1. Therefore, the polarity determining circuit 25 outputs the value (0 or 1) of the MSB of the digital output signal from the ADC 23 to the memory 26 as a polarity determination result.

Note that in order to improve the precision of the polarity determination result, the polarity determination can be performed a plurality of times, and an average of the results of the polarity determinations can be used as the determination result. In that case, an up-down counter capable of counting up to twice the number of times of the polarity determinations can be provided to achieve the averaging, for example.

The averaging in the case where the digital output signal is expressed in two's complement will be specifically described. Before a first polarity determination is performed, a reset signal is first applied to the up-down counter to reset the count value at a midpoint. Each time a digital output signal from the ADC 23 is input to the polarity determining circuit 25, the value of the MSB of the output signal is input to the up-down counter to count up or down. That is, the up-down counter counts up if the input MSB value is 0, and counts down if the input MSB value is 1. Once a last polarity determination for averaging is completed, the MSB count value of the up-down counter at that point in time is output to the memory 26 as the polarity determination result.

The memory 26 is to store the polarity determination result output from the polarity determining circuit 25 and therefore is a memory capable of holding a 1-bit value, 0 or 1. Therefore, the memory 26 is formed by a 1-bit flip-flop (such as a D-FF), for example.

The control circuit 27 is a circuit that controls the analog polarity converting circuit 21 and the digital polarity converting circuit 24 so as to render the polarity of the offset a preset polarity. If the determination result from the polarity determining circuit 25 and the set polarity described above are opposite to each other (if the determination result from the polarity determining circuit 25 is 1, that is, the polarity of the digital output signal is negative, and the set polarity is positive, or if the determination result from the polarity determining circuit 25 is 0, that is, the polarity of the digital output signal is positive, and the set polarity is negative), the control circuit 27 outputs a control signal to perform polarity conversion to the analog polarity converting circuit 21 and the digital polarity converting circuit 24.

Figure 5A:
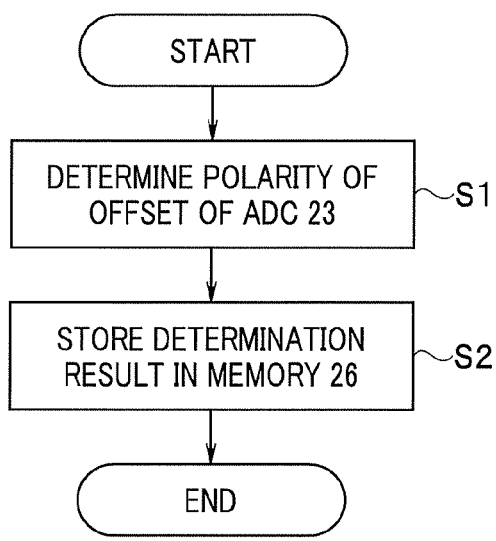
FIG. 5A is a flowchart for illustrating a procedure of AD conversion performed by the AD converting section 2, particularly showing a procedure of determining the polarity of an offset of ADC 23.
Figure 5B:
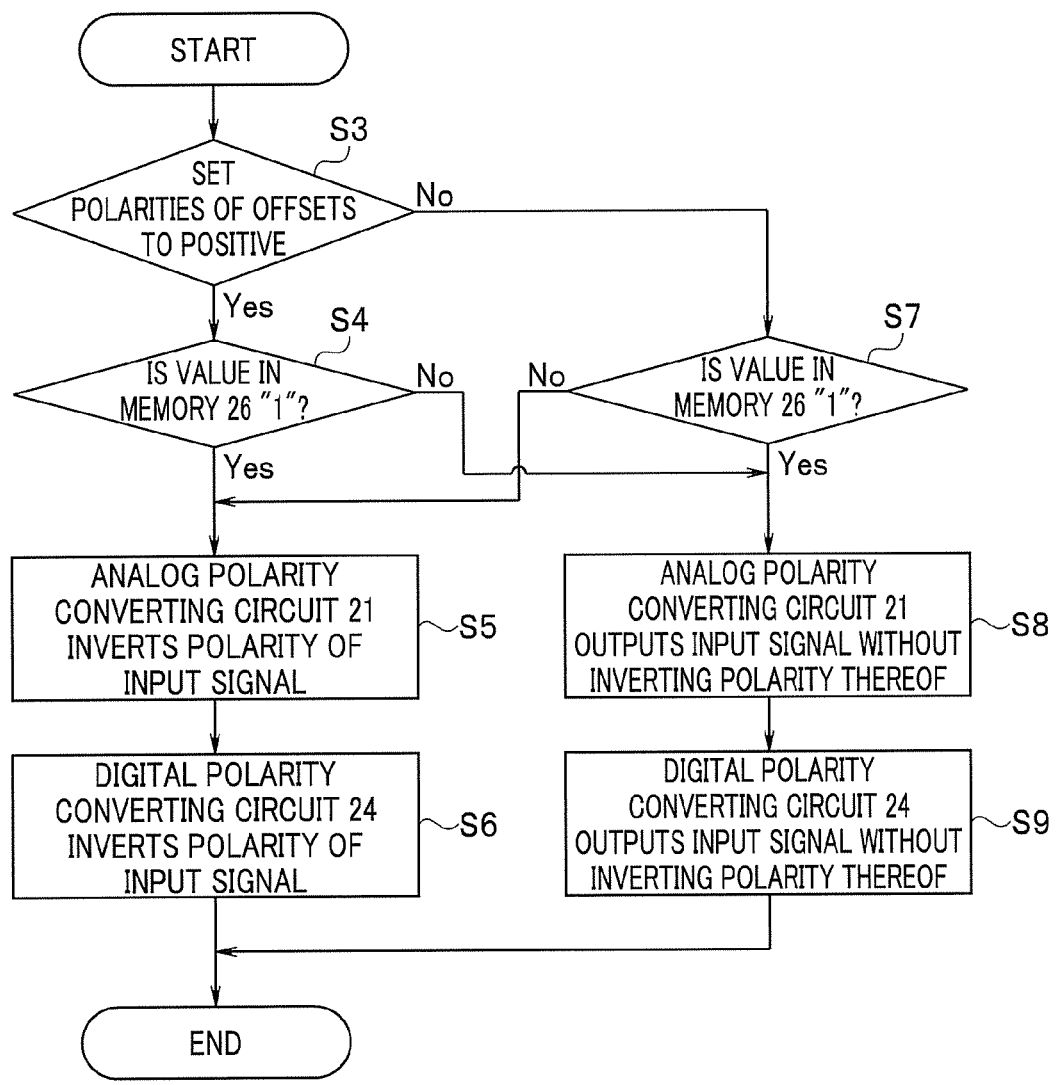
FIG. 5B is a flowchart for illustrating the procedure of AD conversion performed by the AD converting section 2, particularly showing a procedure of a normal AD conversion.

Next, a procedure of AD conversion performed by the AD converting section 2 configured as described above will be described with reference to flowcharts of FIGS. 5A and 5B. FIGS. 5A and 5B are flowcharts for illustrating a procedure of AD conversion performed by the AD converting section 2. FIG. 5A shows a procedure of determining the polarity of the offset of the ADC 23, and FIG. 5B shows a procedure of performing a normal AD conversion. Note that procedures of AD conversion performed by the AD converting sections 3 to 5 are the same as the procedure performed by the AD converting section 2 and therefore will not be described.

First, the procedure of determining the polarity of the offset of the ADC 23 will be described with reference to FIG. 5A. As an initial preparation, the polarity of the offset of the ADC 23 is determined (Step S1), and the result is stored in the memory 26 (Step S2). In Step S1, the switches 221 and 222 in the level setting circuit 22 are turned on to set the voltage of the input signal to the ADC 23 at 0[V]. In this state, the polarity determining circuit 25 determines the polarity of the output signal from the ADC 23. The polarity of the output signal determined by the polarity determining circuit 25, that is, the polarity of the offset of the ADC 23 is stored in the memory 26 in Step S2.

Using the offset polarity determination result obtained as described above, the normal AD conversion is performed according to the procedure shown in FIG. 5B. The AD converter 1 according to this embodiment uniformalizes the polarities of the offsets of all the ADCs forming the AD converting sections 2 to 5 to one of positive and negative, thereby reducing an offset distribution and reducing a spurious. To this end, the uniform offset polarity of all the ADCs forming the AD converting sections 2 to 5 is determined. The uniform offset polarity may be previously set in the control circuit 27 or the like or may be set by referring to the results of polarity determination of all the ADCs.

In the case where the polarities of the offsets of all the ADCs are to be uniformalized to positive (Yes in Step S3), the polarity determination result of the ADC 23 stored in the memory 26 is referred to. If the polarity determination result is 0, that is, the polarity of the digital output signal of the ADC 23 is positive (No in Step S4), the process proceeds to Step S8, in which the analog polarity converting circuit 21 outputs the input analog signal as it is without inverting the polarity thereof. Note that in AD conversion, the switches 221 and 222 in the level setting circuit 22 are turned off to output the input differential analog signal to the ADC 23 without changing the level of the signal. The ADC 23 digitizes the input differential analog signal and outputs the digitized signal to the digital polarity converting circuit 24. The digital polarity converting circuit 24 outputs the input digital signal as it is without inverting the polarity thereof (Step S9).

On the other hand, if the polarity determination result is 1, that is, the polarity of the digital output signal of the ADC 23 is negative (Yes in Step S4), the process proceeds to Step S5, in which the analog polarity converting circuit 21 inverts the polarity of the input differential analog signal. The ADC 23 digitizes the input differential analog signal and outputs the digitized signal to the digital polarity converting circuit 24. The digital polarity converting circuit 24 inverts the polarity of the input digital signal and outputs the digital signal having the polarity inverted (Step S6).

In the case where the polarities of the offsets of all the ADCs are to be uniformalized to negative (No in Step S3), the polarity determination result of the ADC 23 stored in the memory 26 is referred to. If the polarity determination result is 1, that is, the polarity of the digital output signal of the ADC 23 is negative (Yes in Step S7), the process proceeds to Step S8, in which the analog polarity converting circuit 21 outputs the input analog signal as it is without inverting the polarity thereof. The digital polarity converting circuit 24 outputs the input digital signal as it is without inverting the polarity thereof (Step S9).

On the other hand, if the polarity determination result is 0, that is, the polarity of the digital output signal of the ADC 23 is positive (No in Step S7), the process proceeds to Step S5, in which the analog polarity converting circuit 21 inverts the polarity of the input differential analog signal. The ADC 23 digitizes the input differential analog signal and outputs the digitized signal to the digital polarity converting circuit 24. The digital polarity converting circuit 24 inverts the polarity of the input digital signal and outputs the digital signal having the polarity inverted (Step S6).

As described above, if the offset polarity determination result of the ADC 23 is different from (opposite to) the uniform offset polarity of all the ADCs, both the analog polarity converting circuit 21 and the digital polarity converting circuit 24 can invert the polarity of the input signal to output the input differential analog signal without changing the polarity thereof while converting (inverting) the polarity of the offset that occurs in the ADC 23. By setting the polarities of the offsets of all the ADCs in the same direction, the distribution of the offsets of the channels can be reduced.

Figure 6:
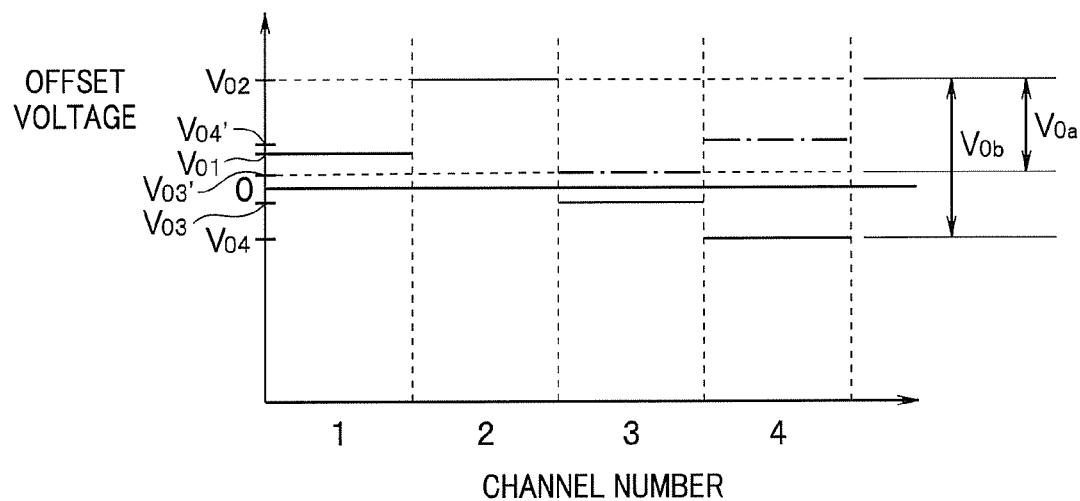
FIG. 6 is a diagram showing an example of offset distributions of channels before and after the polarities of offsets are uniformalized.
Figure 7:
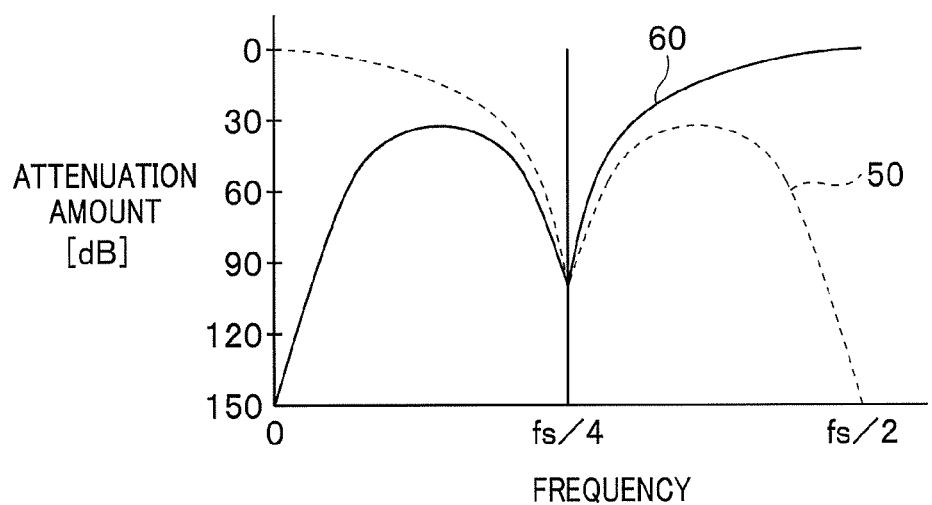
FIG. 7 is a graph showing an example of a frequency characteristic of a reduction amount of an offset-induced component.

The offset reduction effect will be described with reference to FIGS. 6 and 7. FIG. 6 is a diagram showing an example of distributions of the offsets of the channels before and after the offset polarities are uniformalized. FIG. 7 is a diagram showing an example of a frequency characteristic of a reduction amount of an offset-induced component.

FIG. 6 shows the offset of the ADC of each channel in terms of voltage, provided that the four AD converting sections 2 to 5 are channels 1 to 4, respectively. A case where the polarities of the offsets are not to be uniformalized will be first described. For example, it is assumed that the polarities of the offset voltages ($V_{O1}$, $V_{O2}$) of the ADCs of the channels 1 and 2 are both positive, and the polarities of the offset voltages ($V_{O3}$, $V_{O4}$) of the ADCs of the channels 3 and 4 are both negative. In this case, the offset voltages of the ADCs of the four channels are distributed in a range from $V_{O2}$ to $V_{O4}$, and the width is $V_{Ob}$. On the other hand, in the case where polarities of the offsets are to be uniformalized to positive, for example, the offset voltages of the ADCs of the channels 3 and 4 are $V_{O3'}$ ($=-V_{O3}$) and $V_{O4'}$ ($=-V_{O4}$), respectively. In this case, the offset voltages of the ADCs of the four channels are distributed in a range from $V_{O2}$ to $V_{O3'}$, and the width is $V_{Oa}$.

As is apparent from FIG. 6, if the polarities of the offsets are not to be uniformalized, the offsets of the ADCs of the four channels are distributed on both the positive side and the negative side of 0. However, if the polarities of the offsets are uniformalized to either positive or negative, the offsets of the ADCs of the four channels are distributed on only one, positive or negative, side of 0. Therefore, in average, the width of the offset distribution is reduced approximately to half.

Uniformalizing the polarities of the offsets of the ADCs of all the channels to positive or negative is equivalent to applying a filter H(Z) expressed by the following Equation (1) to an offset-induced component.

$$H(Z)=V_{O1}+V_{O2}*Z^{-1}+V_{O3'}*Z^{-2}+V_{O4'}*Z^{-3} \qquad \text{Equation (1)}$$

If all the offsets of the ADCs of the respective channels are equal to each other, that is, if $V_{O1}=V_{O2}=V_{O3'}=V_{O4'}$, the filter H(Z) behaves in the same way as a moving-average filter. That is, the filter H(Z) has a characteristic 50 shown by the dotted line in FIG. 7 and has an effect of reducing components at frequencies other than 0 of offset-induced unwanted wave components of the ADCs with a notch at fs/4.

In the time-interleaved AD converter, offset-induced unwanted wave components appear at frequencies that are multiples of the sampling frequency divided by the number of channels. Therefore, in the AD converter 1, the offset-induced unwanted wave components appear at frequencies that are multiples of fs/4. On the other hand, in the case where signal sampling occurs, a Nyquist frequency (=fs/2) is the reproduction limit, so that the AD converter 1 converts frequency components lower than fs/2. Thus, the frequencies at which offset-induced unwanted wave components appear at frequencies of 0, fs/4 and fs/2 in the AD converter 1.

As described above, if the polarities of the offsets of the ADCs of all the channels are uniformalized, the offset-induced unwanted wave components are reduced at the frequencies of fs/4 and fs/2 at which the offset-induced unwanted wave components appear. Even if the ADC offset differs among the channels, the AD converter 1 exhibits a characteristic similar to the characteristic 50 shown in FIG. 7, although the attenuation amount at the notch is different. Therefore, the effect of reducing the offset-induced unwanted wave components can be achieved.

As described above, according to this embodiment, the polarities of the offsets of the ADCs in all the AD converting sections 2 to 5 forming the AD converter 1 are previously determined. In conversion of an analog signal to a digital signal, the polarities of the offsets of the ADCs in all the AD converting sections 2 to 5 are previously uniformalized to either positive or negative, which is previously set. That is, any ADC having an offset whose polarity is different from the uniform polarity converts (inverts) both the polarity of the differential analog signal input to the ADC and the polarity of the digital signal output form the ADC, thereby converting only the polarity of the offset without affecting the polarities of the input and output signals. In this way, simply by adding a circuit having a simple configuration and a relatively small footprint, the distribution range of the offsets of the ADCs forming the AD converter 1 can be reduced approximately to half and the offset-induced unwanted wave components can be reduced while reducing the increase of the chip footprint.

Note that in the example described above, the control circuit 27 is disposed between the memory 26 and the digital polarity converting circuit 24. Alternatively, however, the control circuit 27 may be disposed between the ADC 23 and the polarity determining circuit 25 or between the polarity determining circuit 25 and the memory 26. That is, the control circuit 27 can be disposed at any position where the control circuit 27 can identify the uniform polarity of all the ADCs and control the polarity inversion by the analog polarity converting circuit 21 and the digital polarity converting circuit 24 using the determination result from the polarity determining circuit 25, and can be connected to any desired element.

The analog polarity converting circuit 21 may not have the configuration shown in FIG. 3 and can have any configuration that allows the analog polarity converting circuit 21 to have a function of choosing to invert the polarity of the input signal. Similarly, the level setting circuit 22 may not have the configuration shown in FIG. 4 and can have any configuration that allows the level setting circuit 22 to have a function of rendering the level difference between the two output signal lines zero. Furthermore, the digital polarity converting circuit 24 may not be formed by a number of XOR circuits equal to the number of bits of the output signal of the ADC 23 as described above and can have any configuration that allows the digital polarity converting circuit 24 to have a function of choosing inverting all the bits of the digital signal output from the ADC 23 (a modification).

A modification of the first embodiment will be described. This modification differs from the first embodiment in that a chopper circuit that pseudo-randomly converts the polarities of the analog input signal and the output digital signal is additionally provided, and the offset-induced unwanted wave components are diffused. The components of an AD converting section 2' according to this modification except for an analog polarity converting circuit 21a, a digital polarity converting circuit 24a and a pseudo-random signal generating circuit 30 are the same components according to the first embodiment and therefore denoted by the same reference numerals and will not be described.

Figure 8:
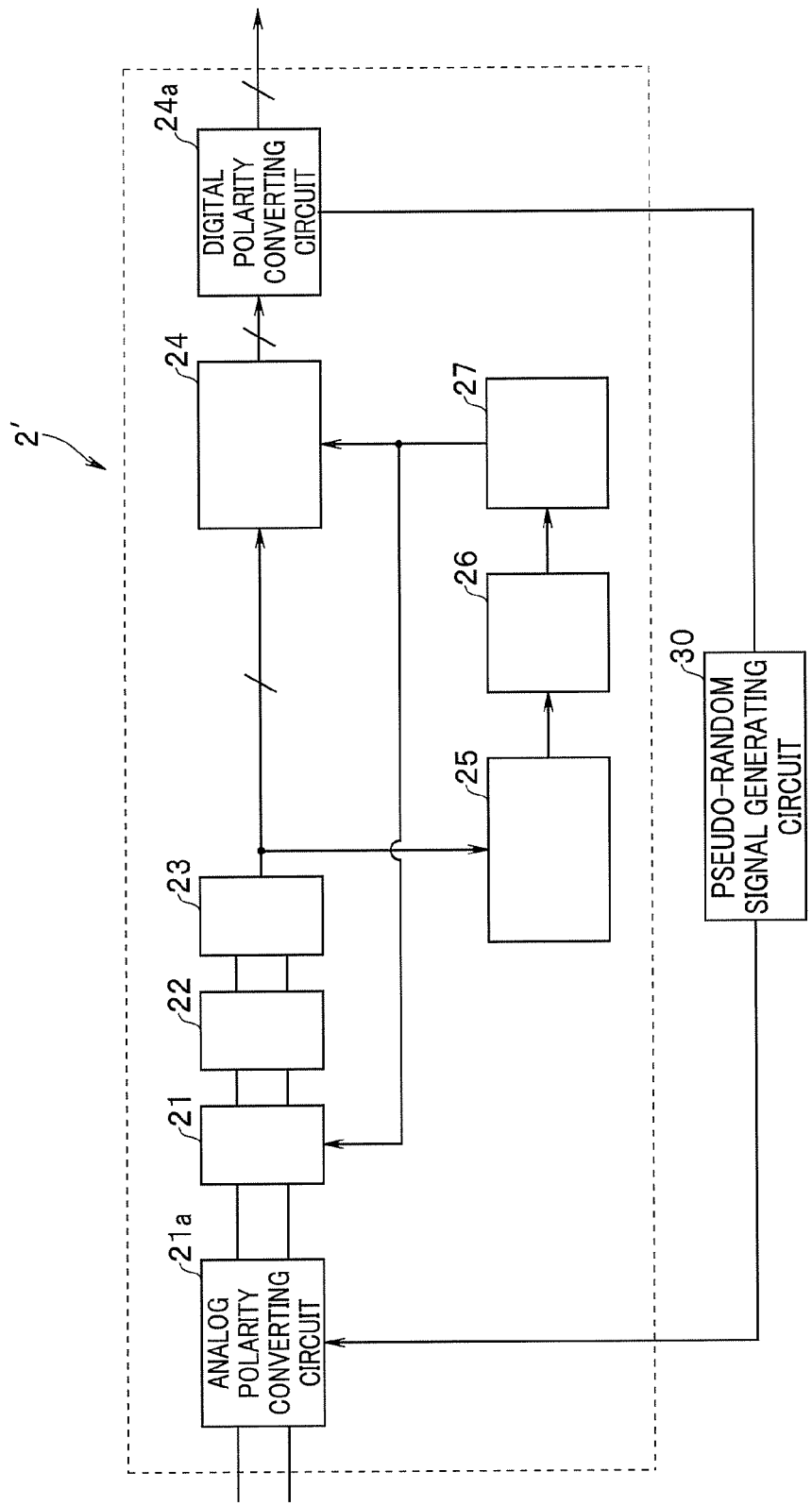
FIG. 8 is a block diagram for illustrating an example of a configuration of an AD converting section 2' according to a modification of the first embodiment.

FIG. 8 is a block diagram for illustrating an example of a configuration of the AD converting section 2' according to this modification of the first embodiment. As shown in FIG. 8, the AD converting section 2' according to this modification includes the analog polarity converting circuit 21a additionally provided on the input side of the AD converting section 2 according to the first embodiment described above and the digital polarity converting circuit 24a additionally provided on the output side thereof. The AD converting section 2' further includes the pseudo-random signal generating circuit 30 serving as a chopper circuit that generates a pseudo-random signal and inputs the pseudo-random signal to the analog polarity converting circuit 21a and the digital polarity converting circuit 24a.

In the AD converter according to this modification, the pseudo-random signal generating circuit 30 outputs a pseudo-random signal to the analog polarity converting circuit 21a and the digital polarity converting circuit 24a. According to the signal, the analog polarity converting circuit 21a pseudo-randomly converts the polarity of an input differential analog signal. According to the signal, the digital polarity converting circuit 24a also pseudo-randomly converts the polarity of an input digital signal and outputs the digital signal having the polarity inverted.

By pseudo-randomly diffusing the polarities of input analog signals, offset-induced tones can be diffused, and the spurious free dynamic range (SFDR) can be improved.

Note that a plurality of pseudo-random signal generating circuits 30 may be provided for the respective ones of the plurality of AD converting sections, or a single pseudo-random signal generating circuit 30 shared by all the AD converting section may be provided. In the case where all the AD converting sections share a single pseudo-random signal generating circuit 30 and the same pseudo-random signal, a filter equivalent to a moving-average filter is applied to offset components diffused by the pseudo-random signal, so that the diffused offset-induced unwanted wave components can be more effectively reduced.

The analog polarity converting circuit 21a can be integrated with the analog polarity converting circuit 21, and the digital polarity converting circuit 24a can be integrated with the digital polarity converting circuit 24. In that case, the analog polarity converting circuit 21a and the digital polarity converting circuit 24a are not provided, and the analog polarity converting circuit 21 and the digital polarity converting circuit 24 performs polarity conversion of their respective input signals based on the pseudo-random signal output from the pseudo-random signal generating circuit 30 and the polarity conversion control signal output from the control circuit 27.

For example, a configuration in which the pseudo-random signal generating circuit 30 outputs a pseudo-random signal to the control circuit 27 is possible. Even when the polarity determination result for the offset of the ADC 23 is the same as the uniform polarity of the offsets of all the ADCs, if the pseudo-random signal indicates that polarity conversion be performed, the control circuit 27 outputs a control signal to perform polarity conversion to the analog polarity converting circuit 21 and the digital polarity converting circuit 24. Even when the polarity determination result for the offset of the ADC 23 is different from (opposite to) the uniform polarity of the offsets of all the ADCs, if the pseudo-random signal indicates that polarity conversion be performed, the control circuit 27 does not instruct the analog polarity converting circuit 21 and the digital polarity converting circuit 24 to perform polarity conversion.

As described above, simply by providing the pseudo-random signal generating circuit 30 in addition to the components of the AD converter 1 according to the first embodiment described above, the offset-induced unwanted wave components can be further reduced.

Second Embodiment

The AD converter 1 according to the first embodiment described above performs such a control as to uniformalize the polarities of the offsets of all the AD converting sections 2 to 5 in the same direction. A second embodiment differs from the first embodiment in that a control is performed so that the offsets of adjacent channels have the opposite polarities. The configuration of an AD converter according to this embodiment is the same as the configuration of the AD converter according to the first embodiment described above with reference to FIGS. 1 to 4 and therefore will be described with reference to the same drawings, and components common to the embodiments will not be further described. In the following, a difference from the AD converter according to the first embodiment, that is, a method in which the control circuit 27 in the AD converting section 2 controls the analog polarity converting circuit 21 and the digital polarity converting circuit 24 will be described.

First, as in the first embodiment, as an initial preparation, the polarities of the offsets of the ADCs 23 in all the AD converting sections 2 to 5 forming the AD converter 1 are determined, and the result is stored in the memory 26. The direction in which the polarity of the offset of each AD converting section 2 to 5 is adjusted is then determined, and the control circuit 27 in each AD converting section 2 to 5 is set to perform the adjustment.

Provided that the four AD converting sections 2 to 5 shown in FIG. 1 are channels 1 to 4, respectively, the polarities of the offsets are for the odd-numbered channels, the channel 1 (the AD converting section 2) and the channel 3 (the AD converting section 4), are uniformalized in the same direction. Similarly, the polarities of the offsets of the even-numbered channels, the channel 2 (the AD converting section 3) and the channel 4 (the AD converting section 5), are uniformalized in the same direction. The polarity of the offsets for the even-numbered channels is set to be opposite to the polarity of the offsets of the odd-numbered channels. For example, if the polarities of the offsets of the odd-numbered channels are uniformalized in the positive direction, the polarities of the offsets of the even-numbered channels are uniformalized in the negative direction.

In a channel for which the offset polarity determination result disagree with the set offset polarity, when a signal is input to the analog polarity converting circuit 21 and the digital polarity converting circuit 24, the analog polarity converting circuit 21 and the digital polarity converting circuit 24 invert the polarity of the signal and output the signal having the polarity inverted. That is, the analog polarity converting circuit 21 inverts the polarity of the input differential analog signal and outputs the input differential analog signal having the polarity inverted, and the digital polarity converting circuit 24 inverts the polarity of the signal digitized by the ADC 23 and outputs the digital signal having the polarity inverted. In a channel for which the offset polarity determination result agrees with the set offset polarity, the analog polarity converting circuit 21 and the digital polarity converting circuit 24 do not change the polarity of the input signal and output the input signal as it is.

As described above, setting the polarities of the offsets of the adjacent channels in the opposite directions is equivalent to applying to an offset-induced unwanted wave component a filter H(Z') expressed by the same equation as Equation (1) described above with regard to the first embodiment except that the coefficients in the second and fourth terms ($V_{02}$, $V_{04'}$) are negative. That is, the filter H(Z)' has the characteristic of the moving-average filter inverted with respect to the frequency axis (a characteristic 60 shown by the solid line in FIG. 7) and has an effect of reducing components at frequencies other than the Nyquist frequency (=fs/2) of the offset-induced unwanted wave components of the ADCs.

In the time-interleaved AD converter, offset-induced unwanted wave components appear at frequencies that are multiples of the sampling frequency divided by the number of channels. Therefore, in the AD converter 1, the offset components appear at frequencies that are multiples of fs/4. On the other hand, in the case where signal sampling occurs, a Nyquist frequency (=fs/2) is the reproduction limit, so that the AD converter 1 converts frequency components lower than fs/2. Thus, offset components appear at frequencies of 0, fs/4 and fs/2 in the AD converter 1. That is, in the case where the polarities of the offsets of the adjacent channels are set in the opposite directions, the offset components are reduced at the frequencies of 0 and fs/4 at which the offset components appear.

As described above, according to this embodiment, the polarities of the input signals are controlled so as to set the directions of the offsets of the adjacent channels in the opposite directions using the AD converter 1 having the same configuration as that in the first embodiment, and therefore, the offset-induced unwanted wave components at other frequencies than the Nyquist frequency can be reduced while reducing the increase of the chip footprint.

Note that as in the first embodiment, the control circuit 27 may be disposed between the ADC 23 and the polarity determining circuit 25, between the polarity determining circuit 25 and the memory 26 or between the memory 26 and the digital polarity converting circuit 24. That is, the control circuit 27 can be disposed at any position where the control circuit 27 can control the polarity inversion by the analog polarity converting circuit 21 and the digital polarity converting circuit 24 so as to set the offset polarities in the set directions using the determination result from the polarity determining circuit 25, and can be connected to any desired element.

The offset polarity controlling method according to this embodiment can be applied not only to the AD converting section 2 having the configuration shown in FIG. 2, but also to the AD converting section 2' according to the modification of the first embodiment shown in FIG. 8. That is, by generating a pseudo-random signal to pseudo-randomly diffuse the polarities of input analog signals, offset-induced tones can be diffused, and the spurious free dynamic range (SFDR) can be improved.

Third Embodiment

The AD converters 1 according to the first and second embodiments described above use the polarity determining circuit 25 to determine the polarities of the offsets of the AD converting sections 2 to 5 as an initial preparation. A third embodiments differs from the first and second embodiments in that the polarity determination is previously performed off-chip, and the determination result is stored in an internal memory or the like. The configuration of the AD converter 1 according to this embodiment is the same as the configuration of the AD converter according to the first embodiment described above with reference to FIG. 1 and therefore will not be described.

Figure 9:
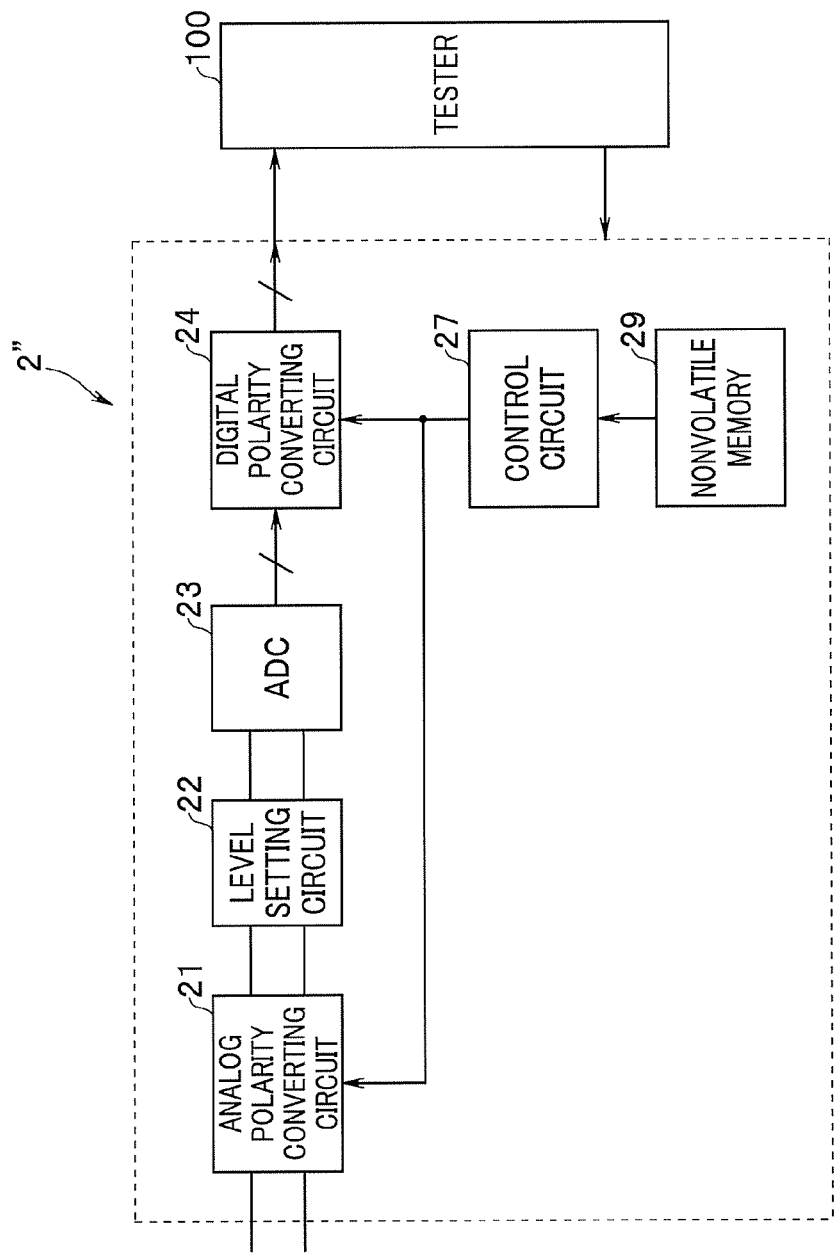
FIG. 9 is a block diagram for illustrating an example of a configuration of an AD converting section 2" according to a third embodiment.

FIG. 9 is a block diagram for illustrating an example of a configuration of an AD converting section 2" according to the third embodiment. That is, the third embodiment differs from the first embodiment in that an apparatus that performs polarity determination off-chip (a tester 100, for example) is used instead of the polarity determining circuit 25, and a nonvolatile memory 29 is used as a memory that stores the determination result. The other components of the AD converting section are the same as those in the AD converter according to the first embodiment described above with reference to FIG. 2 and therefore denoted by the same reference numerals and will not be described.

A method of determining the polarity of the ADC 23 in the AD converting section configured as described above and a method of controlling the polarity in AD conversion will be described.

The AD converter 1 according to this embodiment performs the polarity determination for the AD converting section 2" off-chip in a pre-shipment test during the manufacturing process, for example. A tester (an inspection apparatus) 100 is connected to the AD converting section 2", and the switches 221 and 222 in the level setting circuit 22 are turned on to set the voltage of the input signal to the ADC 23 at a reference voltage (0[V], for example). In this state, the polarity of the output signal from the ADC 23 is determined with the tester 100. The determined polarity of each ADC 23 is stored in the nonvolatile memory 29. Note that in the polarity determination, both the analog polarity converting circuit 21 and the digital polarity converting circuit 24 do not change the polarities of the respective input signals and output the input signals as they are. As in the first embodiment, the polarity determination with the tester 100 may be performed only once or performed a plurality of times. In the latter case, the polarity is determined by averaging the determination results. The result of the polarity determination with the tester 100, that is, the polarity of the offset of the ADC 23 is stored in the nonvolatile memory 29. The polarity determination method for the other AD converting sections forming the AD converter 1 is the same as the method for the AD converting section 2" and therefore will not be described.

Once the polarity determination is completed, the tester 100 is disconnected from the AD converting section 2". In the case of AD conversion using the AD converting section 2", the control circuit 27 controls the operations of the analog polarity converting circuit 21 and the digital polarity converting circuit 24 based on the polarity determination result stored in the nonvolatile memory 29 and the preset direction of the adjustment of the polarity of the offset of the ADC 23. Note that the polarities of the offsets of the respective AD converting sections 2 to 5 may be set so that the polarities of the offsets of all the channels are uniformalized in the same direction as in the first embodiment or may be set so that the polarities of the offsets of the adjacent channels are set in the opposite directions as in the second embodiment. The specific procedure of controlling the operations of the analog polarity converting circuit 21 and the digital polarity converting circuit 24 is the same as that according to the first or second embodiment and therefore will not be described.

As described above, according to this embodiment, the polarity determination is performed with another apparatus, such as the tester 100, so that the polarity determining circuit does not have to be provided in the AD converter. Therefore, the chip footprint can be reduced while maintaining the effect of reducing the offset-induced unwanted wave components.

Note that as in the modification of the first embodiment, the AD converter according to this embodiment may include the pseudo-random signal generating circuit 30. That is, by generating a pseudo-random signal to pseudo-randomly diffuse the polarities of input analog signals, offset-induced tones can be diffused, and the spurious free dynamic range (SFDR) can be improved.

Fourth Embodiment

The AD converters 1 according to the first to third embodiments described above reduce the offset-induced unwanted wave components by determining the polarities of the offsets in the case where a signal at a reference voltage (0[V], for example) is input as a signal source whose voltage value is known and controlling the polarities of the respective channels. However, the AD converter requires not only the reduction of the offset-induced unwanted wave components but also improvements of other conversion characteristics, in particular, the linearity.

To calibrate the linearity of the AD converter, typically, a signal source having a known characteristic is input to make such an adjustment as to make the value of the output signal agree with an ideal value. In this case, the precision of the calibration largely depends on the characteristic (purity) of the signal source. However, in the case where the calibration is performed on-chip, it is extremely difficult to form a signal source having a known characteristic and a sufficient purity. Therefore, there is a problem that it is extremely difficult to improve the linearity by on-chip calibration.

In view of such circumstances, a conventional AD converter reduces such an error of the linearity by increasing the element size of the AD converting units. For example, if the element size is increased by a factor of four, the error can be theoretically reduced approximately to half ($=1/\sqrt{4}$). However, if the element size is increased, a problem arises that the footprint of the entire chip also increases.

To solve the problem, a fourth embodiment aims at providing an AD converter that can reduce offset-induced unwanted wave components while suppressing the increase of the chip footprint and can improve the linearity.

Figure 10:
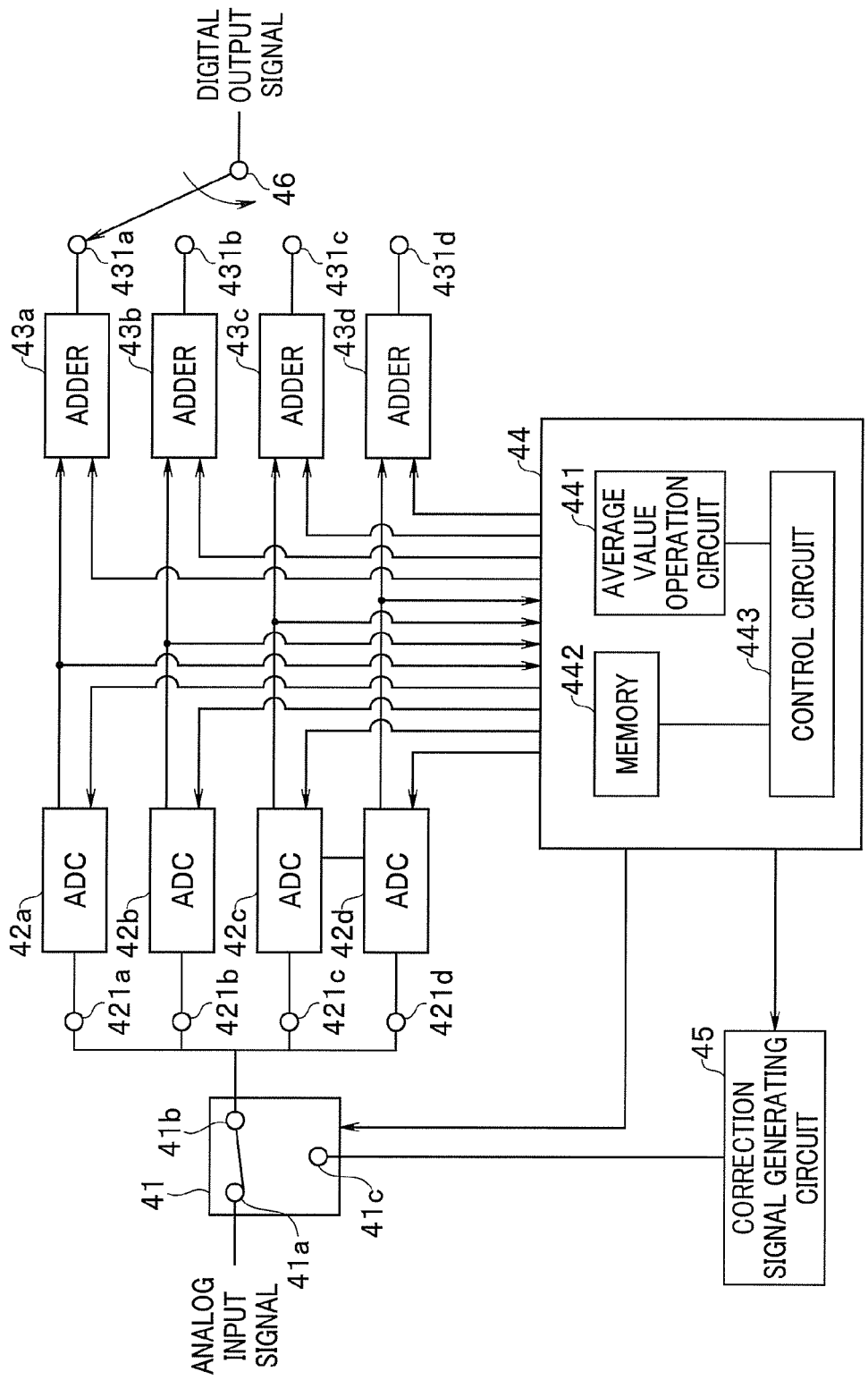
FIG. 10 is a block diagram for illustrating an example of a configuration of an AD converter according to a fourth embodiment.

FIG. 10 is a block diagram for illustrating an example of a configuration of an AD converter according to the fourth embodiment. As shown in FIG. 10, the AD converter according to this embodiment is a time-interleaved AD converter including a plurality of ADCs arranged in parallel with each other with respect to input/output signals. For example, as shown in FIG. 10, the AD converter includes four (four channels of) ADCs 42a, 42b, 42c and 42d, which have substantially the same structure. (In the following, the ADC 42a will be referred to as a channel 1, the ADC 42b will be referred to as a channel 2, the ADC 42c will be referred to as a channel 3, and the ADC 42d will be referred to as a channel 4.)

Note that sampling clocks shifted in phase by a predetermined amount are supplied to the respective ADCs 42a to 42d. Each ADC 42a to 42d independently outputs a signal obtained by digitizing an amplitude value of a differential analog input signal at a timing responsive to the sampling clock.

With such a configuration, the AD converter can sample input signals at a sampling frequency higher than the frequency of the sampling clock thereof. For example, provided that the respective ADCs 42a to 42d have a sampling frequency of fs (that is, a sampling period of 1/fs), the sampling clocks supplied to the respective ADCs 42a to 42d are shifted in phase by 1/4*fs. As a result, the whole of the AD converter 1 can have an input signal sampling frequency equivalent to 4*fs.

Furthermore, as shown in FIG. 10, the AD converter according to this embodiment includes the ADCs 42a to 42d, an input signal switching circuit 41, a correction controlling section 44, adders 43a to 43d, a correction signal generating circuit 45, and an output terminal 46. The input signal switching circuit 41 is a switch section that switches a signal input to the ADCs 42a to 42d. The correction controlling section 44 controls a correction on the linearity of each of the ADCs 42a to 42d. The adders 43a to 43d add a correction value output from the correction controlling section 44 to the respective ADCs 42a to 42d. The correction signal generating circuit 45 generates a correction signal input to the ADCs 42a to 42d in correction value calculation. A digital signal subjected to a correction processing is output at the output terminal 46.

The input signal switching circuit 41 is provided as a three-way switch having input terminals 41a and 41c and an output terminal 41b. In the case where a differential analog input signal is to be input to each ADC 42a to 42d, the switch switchably connects the input terminal 41a and the output terminal 41b to each other. In the case where the correction signal output from the correction signal generating circuit 45 described later is to be input to each ADC 42a to 42d, the switch switchably connects the input terminal 41c and the output terminal 41b to each other. Switching of the input signal switching circuit 41 is controlled by the correction controlling section 44.

The output terminal 41b of the input signal switching circuit 41 and input terminals 421a, 421b, 421c and 421d of the respective ADCs 42a to 42d are connected in parallel with each other so that the differential analog input signal is input to the input terminals 421a, 421b, 421c and 421d of the respective ADCs 42a to 42d in parallel with each other.

In correction value calculation in which the input terminal 41c and the output terminal 41b are connected to each other, and the correction signal is input to the ADCs 42a to 42d, a clock is supplied that makes the respective ADCs 42a to 42d sample a signal at the same time. On the other hand, in the normal AD conversion operation in which the input terminal 41a and the output terminal 41b are connected to each other, and the differential analog input signal is input to the ADCs 42a to 42d, clocks shifted in sampling phase by 1/4*fs are supplied to the respective ADCs 42a to 42d, as described above.

Note that in the normal AD conversion operation, the output terminal 41b and the input terminals 421a to 421d of the respective ADCs 42a to 42d can be provided as terminals of a rotary switch, which switchably establishes a connection at a timing of sampling. Similarly, the output terminal 46 and output terminals 431a, 431b, 431c and 431d of the adders 43a to 43d may be provided as terminals of a rotary switch, which switchably establishes a connection at a timing of sampling or may be directly connected to each other. (Note that in the case of the direct connection, the other outputs other than any one output are controlled to be in a high impedance state.)

In the normal AD conversion operation in which the differential analog input signal is input, the adders 43a to 43d adds the correction value output from the correction controlling section 44 described later to the signals digitized by and output from the respective ADCs 42a to 42d.

The correction controlling section 44 calculates the correction value used for correction of the linearity of the ADCs 42a to 42d. In the normal AD conversion operation, the correction controlling section 44 controls the correction processing for the digital signals output from the ADCs 42a to 42d. The correction controlling section 44 includes an average value operation circuit 441, a memory 442 and a control circuit 443. In the correction value calculation, the average value operation circuit 441 captures the digital signals output from the respective ADCs 42a to 42d and calculates an average value for the four channels. In addition, the average value operation circuit 441 calculates the differences between the calculated average value for all the channels and the output values of the individual ADCs 42a to 42d. In addition, the average value operation circuit 441 calculates the correction value from the differences between the output values from the ADCs 42a to 42d and the average value for all the channels. The method of calculating the correction value will be described in detail later.

The memory 442 is formed by a DRAM, a flash memory, a flip-flop or the like and stores the correction value calculated by the average value operation circuit 441. The control circuit 443 controls the input signal switching circuit 41 to switch between a correction value calculation mode and a (normal) AD conversion mode. In addition, in the correction value calculation, the control circuit 443 instructs the correction signal generating circuit 45 to generate the correction signal or control signal input and output of the average value operation circuit 441. In addition, in the normal AD conversion operation, the control circuit 443 controls signal input and output among the ADCs 42a to 42d, the memory 442 and the adders 43a to 43d.

Figure 11:
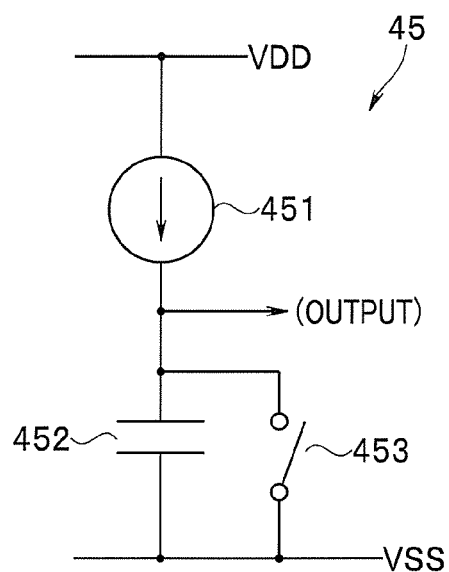
FIG. 11 is a circuit diagram for illustrating an example of a correction signal generating circuit 45.

The correction signal generating circuit 45 is a circuit that generates an analog signal within a range in which a digital output signal to be corrected is obtained and is configured as shown in FIG. 11, for example. FIG. 11 is a circuit diagram for illustrating an example of the correction signal generating circuit 45.

As shown in FIG. 11, the correction signal generating circuit 45 has a constant current source 451 and a capacitor 452 connected in series with each other between a power supply voltage $V_{DD}$ and a reference voltage $V_{SS}$ and provides an output signal from between the constant current source 451 and the capacitor 452. With such a configuration, a signal that increases (or decreases) in voltage with time can be generated and output. Note that a reset switch 453 is provided in parallel with the capacitor 452, and generation of the correction signal starts when the reset switch 453 is switched from an on state to an off state. The switching of the reset switch 453 is controlled by the control circuit 443 in the correction controlling section 44.

Note that the correction signal generating circuit 45 is not limited to the configuration shown in FIG. 11 and can be any circuit that generates an analog signal within a range in which a digital output signal to be corrected is obtained and can generate a signal that increases (or decreases) in voltage with time. For example, the correction signal generating circuit 45 can be formed by a DA converter or an oscillator having an arbitrary configuration.

An operation of the AD converter configured as described above will be described. The AD converter according to this embodiment calculates the correction value for the output signal from each ADC before starting the normal AD conversion operation. In the following, an operation of calculating the correction value (the correction value calculation mode) will be first described, and the normal AD conversion operation (the AD conversion mode) will be then described.

First, an operation of the AD converter in the correction value calculation mode will be described. First, the control circuit 443 in the correction controlling section 44 outputs a control signal to the input signal switching circuit 41 and the correction signal generating circuit 45. In the input signal switching circuit 41, switching occurs to connect the input terminal 41c and the output terminal 41b to each other so that the control signal output from the correction signal generating circuit 45 is supplied to the ADCs 42a to 42d. In the correction signal generating circuit 45, the reset switch 453 shown in FIG. 11, for example, is switched from the on state to the off state to start generation and output of the correction signal.

In addition, the control circuit 443 in the correction controlling section 44 supplies to the ADCs 42a to 42d clocks that make the ADCs sample a signal at the same time (that is, clocks having the same sampling frequency and phase). According to the clocks, the ADCs 42a to 42d digitize the input correction signal and output the digitized signal. The correction controlling section 44 captures the digital signals output from the ADCs 42a to 42d, and the average value operation circuit 441 calculates an average value for all the channels.

More specifically, each time the correction controlling section 44 captures digital signals, the average value for all the channels is calculated by dividing the sum of the voltages of the digital signals output from the respective ADCs 42a to

42*d* by the number of the ADCs forming the AD converter (4, in this case). In addition, for each channel, the difference between the value of the digital output signal and the average value for all the channels is calculated.

The calculation of the average value for all the channels and the calculation of the difference between the value of the digital output signal of each channel and the average value for all the channels are performed each time the correction controlling section 44 captures digital signals. Once the sampling and the calculation are completed for the entire range of the digital output signals to be corrected, calculation of the correction value starts. One correction value is calculated for each channel and for each digital output signal value. A method of calculating the correction value will be described with reference to FIG. 12.

Figure 12:
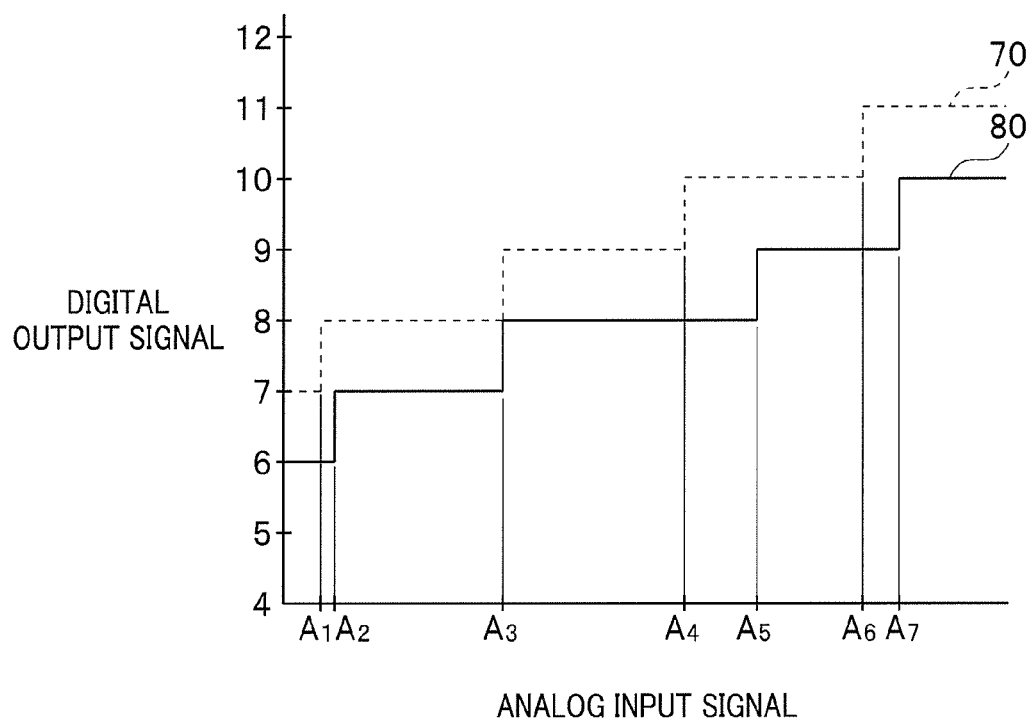
FIG. 12 is a graph showing an example of a relationship between an input correction signal and an output digital output signal.

FIG. 12 is a graph showing an example of a relationship between the input correction signal and the output digital output signal. In FIG. 12, a characteristic 70 shown by the dotted line shows the average value for all the channels, and a characteristic 80 shown by the solid line shows the value of the digital output signal of one individual channel. As shown in FIG. 12, both the average value for all the channels and the output value of one individual channel increase stepwise as the value of the correction signal increases. However, the average value for all the channels and the output value of one individual channel differ in level and positions of steps.

Focusing on the ranges of the input signal where one individual channel provides the same conversion result (a digital output signal having the same value), in the example shown in FIG. 12, the value of the output signal is 6 in the range of the value of the correction signal equal to or lower than $A_2$, the value of the output signal is 7 in the range of the value of the correction signal from $A_2$ to $A_3$, the value of the output signal is 8 in the range of the value of the correction signal from $A_3$ to $A_5$, and the value of the output signal is 9 in the range of the value of the correction signal from $A_5$ to $A_7$ and the range of the value of the correction signal equal to or higher than $A_7$. The difference between the output value in the ranges where the same conversion result is obtained and the average value is used as the correction value for the output value of the channel.

For example, in the range of the value of the correction value from $A_2$ to $A_3$ (the range where the value of the output signal is 7), the value of the digital output signal is 7, and the average value for all the channels is 8, so that the difference is −1. Since it is necessary to perform correction so as to cancel the difference, the correction value is set to a value obtained by positive-negative invention of the difference. Therefore, the correction value calculated for the range where the value of the output signal of the channel is 7 is +1.

However, since the characteristic 70 of the average value for all the channels and the characteristic 80 of the output value of one individual channel differ in positions of steps, even in a range of the input signal where one individual channel provides the same conversion result, the difference between the average value and the output value of the channel is not always uniquely determined. For example, in FIG. 12, the range of the value of the correction signal equal to or lower than $A_2$ (the range where the value of the output signal is 6) is further divided into a range where the difference between the output value of one individual channel and the average value for all the channels is −1 and a range where the difference is −2. Similarly, the range of the value of the correction signal from $A_3$ to $A_5$ (the range where the value of the output signal is 8) and the range of the value of the correction signal from $A_5$ to $A_7$ (the range where the value of the output signal is 9) are each further divided into a range where the difference between the output value of one individual channel and the average value for all the channels is −1 and a range where the difference is −2. The correction value in such a case is calculated as described below, for example.

A first approach is to calculate, as the correction value, an average value of the differences between the output value of the digital signal and the average value for all the channels for the range where one individual channel provides a digital output signal (yet to be corrected) having the same value. A second approach is to adopt as the correction value the value of the difference between the output value of the digital signal and the average value for all the channels that occurs at the maximum frequency in the range where one individual channel provides a digital output signal (yet to be corrected) having the same value.

A specific example of the method of calculating the correction value according to the second approach will be described with reference to FIG. 12. In FIG. 12, the range of the value of the correction signal from $A_3$ to $A_5$ (the range where the value of the output signal is 8) is further divided into a range where the difference between the output value of one individual channel and the average value for all the channels is −1 and a range where the difference is −2. The difference is −1 in the range of the value of the correction value from $A_3$ to $A_4$, and the difference is −2 in the range of the value of the correction signal from $A_4$ to $A_5$. The range of the value of the correction signal from $A_3$ to $A_4$ is wider than the range of the value of the correction signal from $A_4$ to $A_5$, and therefore, the correction value for this range (the range where the value of the output signal is 8) is calculated to be +1.

The correction value calculated by the average value operation circuit 441 is associated with the channel and the value of the digital output voltage in a one-to-one relationship and stored in the memory 442, and the correction value calculation mode is then ended. Note that the two methods described above are not the only methods of calculating the correction value, and the correction value can be calculated in any optimal method depending on the characteristics, use and design of the AD converter.

Next, the normal AD conversion operation (the AD conversion mode) will be described. First, the control circuit 443 in the correction controlling section 44 outputs a control signal to the input signal switching circuit 41 and the correction signal generating circuit 45. In the input signal switching circuit 41, switching occurs to connect the input terminal 41*a* and the output terminal 41*b* thereof to each other so that the differential analog input signal is supplied to the ADCs 42*a* to 42*d*. In the correction signal generating circuit 45, the reset switch 453 shown in FIG. 11, for example, is switched from the on state to the off state to stop generation of the correction signal.

In addition, the control circuit 443 in the correction controlling section 44 supplies to the ADCs 42*a* to 42*d* clocks that have the same frequency and are shifted in phase by 1/4*fs. According to the clocks, the ADCs 42*a* to 42*d* digitize the input differential analog input signal and output the digitized signal. The correction controlling section 44 captures the digital output signals from the ADCs 42*a* to 42*d*, and retrieves the correction values for the respective channels from the memory 442 and outputs the correction values to the adders 43*a* to 43*d*. That is, the correction controlling section 44 retrieves the associated ones of the correction values stored in the memory 442 using the channel identification numbers and the values of the digital output voltages as keys.

The retrieved four correction values are output to the adders to which the digital output signals of the respective associated channels are input. That is, the correction value for the channel 1 is output to the adder 43a. Similarly, the correction values for the channels 2, 3 and 4 are output to the adders 43b, 43c and 43d, respectively. The adders 43a to 43d add the correction values received from the correction controlling section 44 to the digital output signals received from the ADCs 42a to 42d, and output the results.

As described above, according to this embodiment, calibration is performed by calculating the correction values for the linearity based on the differences between the average value of the digital output signals of the plurality of ADCs forming the AD converter and the values of the digital output signals of the individual ADCs. Therefore, the calibration does not need a signal source having a known characteristic and a sufficient purity, and the linearity can be readily improved. In addition, the chip footprint does not need to be increased several times, and the capability of improving the linearity can be additionally provided simply by adding a circuit having a relatively simple configuration and a relatively small footprint. Therefore, the offset-induced unwanted wave components can be reduced and the linearity can be improved while suppressing the increase of the chip footprint.

In the example described above, sections of the correction signal generating circuit 45, the average value operation circuit 441 and other circuits used only in the correction value calculation mode are incorporated in the AD converter. However, these sections may be separated and incorporated in another, off-chip apparatus, such as the tester. In that case, the chip footprint can be further reduced.

Each "section" used in this specification is a conceptual entity that serves a corresponding function according to an embodiment and does not always correspond to a particular piece of hardware or software routine in a one-to-one relationship. Therefore, in this specification, embodiments have been described with regard to virtual circuit blocks (sections) having the respective functions according to the embodiments.

While certain embodiments have been described, these embodiments have been presented by way of example only, and are not intended to limit the scope of the inventions. Indeed, the novel devices and methods described herein may be embodied in a variety of other form; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. An AD converter comprising a plurality of channels of AD converting sections that sequentially operate at predetermined time intervals, wherein each of the AD converting sections comprises:
a data converting section that converts an analog signal into a digital signal and outputs the digital signal;
an analog polarity converting circuit that inverts or does not invert a polarity of an analog input signal before supplying the analog input signal to the data converting section as the analog signal;
a digital polarity converting circuit that inverts or does not invert a polarity of the digital signal from the data converting section before outputting the digital signal; and
a controlling section that controls inversion processing by the analog polarity converting circuit and the digital polarity converting circuit based on a specific polarity value that indicates the polarity of the digital signal obtained from the data converting section in a case where an analog signal at a reference voltage is supplied to the data converting section.

2. The AD converter according to claim 1, further comprising:
a memory that stores the specific polarity value,
wherein the controlling section controls polarity inversion operations of the analog polarity converting circuit and the digital polarity converting circuit based on the specific polarity value stored in the memory and a set polarity value that is previously set.

3. The AD converter according to claim 2, wherein the memory is a nonvolatile memory.

4. The AD converter according to claim 2, further comprising:
a polarity determining circuit that determines the specific polarity value based on an output of the data converting section and stores the specific polarity value in the memory.

5. The AD converter according to claim 4, wherein in a case where the specific polarity value stored in the memory is different from the set polarity value previously set, the controlling section makes the analog polarity converting circuit invert a polarity of the analog signal and output the analog signal having the polarity inverted to the data converting section and makes the digital polarity converting circuit invert the polarity of the digital signal.

6. The AD converter according to claim 4, wherein the controlling section makes the analog polarity converting circuit and the digital polarity converting circuit operate in association with each other.

7. The AD converter according to claim 2, wherein in a case where the specific polarity value stored in the memory is different from the set polarity value previously set, the controlling section makes the analog polarity converting circuit invert a polarity of the analog signal and output the analog signal having the polarity inverted to the data converting section and makes the digital polarity converting circuit invert the polarity of the digital signal.

8. The AD converter according to claim 2, wherein the controlling section makes the analog polarity converting circuit and the digital polarity converting circuit operate in association with each other.

9. The AD converter according to claim 2, wherein the set polarity value has a same polarity for all of the plurality of channels of AD converting sections.

10. The AD converter according to claim 2, wherein the set polarity value has different polarities for adjacent AD converting sections of the plurality of channels of AD converting sections.

11. The AD converter according to claim 2, further comprising:
a pseudo-random signal generating circuit that converts polarities of an analog signal input to the analog polarity converting circuit and a digital signal output from the digital polarity converting circuit with a same pseudo-random signal.

12. An AD conversion method for an AD converter comprising a plurality of channels of AD converting sections that sequentially operate at predetermined time intervals, the method comprising, in each of the plurality of channels of AD converting sections:
inverting or not inverting a polarity of an analog input signal based on information on an element characteristic of a data converting section, which converts an analog signal into a digital signal and outputs the digital signal, before outputting the analog input signal, converting the analog input single output with the polarity inverted or not inverted into a digital signal, and inverting or not inverting a polarity of the digital signal resulting from the conversion based on the information on the element characteristic of the data converting section before outputting the digital signal, wherein a specific polarity value that indicates the polarity of the digital signal obtained from the data converting section is used in a case where an analog signal at a reference voltage is supplied to the data converting section as the information on the element characteristic of the data converting section, and a polarity inversion operation for the analog input signal and a polarity inversion operation for the digital signal are controlled based on the specific polarity value and a set polarity value previously set.

13. The AD conversion method according to claim 12, wherein the set polarity value has a same polarity for all of the plurality of channels of AD converting sections.

14. The AD conversion method according to claim 12, wherein the set polarity value has different polarities for adjacent AD converting sections of the plurality of channels of AD converting sections.

\* \* \* \* \*